United States Patent
Shimada et al.

(10) Patent No.: US 9,397,649 B2
(45) Date of Patent: Jul. 19, 2016

(54) SEMICONDUCTOR DEVICE AND DISPLAY DEVICE

(71) Applicant: Sharp Kabushiki Kaisha, Osaka (JP)

(72) Inventors: Yukimine Shimada, Osaka (JP); Hirohiko Nishiki, Osaka (JP); Kenichi Kitoh, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/426,818

(22) PCT Filed: Sep. 9, 2013

(86) PCT No.: PCT/JP2013/074214
§ 371 (c)(1),
(2) Date: Mar. 9, 2015

(87) PCT Pub. No.: WO2014/042116
PCT Pub. Date: Mar. 20, 2014

(65) Prior Publication Data
US 2015/0236687 A1    Aug. 20, 2015

(30) Foreign Application Priority Data

Sep. 11, 2012    (JP) ................................. 2012-199726

(51) Int. Cl.
*G01R 31/02* (2006.01)
*H03K 17/14* (2006.01)
(Continued)

(52) U.S. Cl.
CPC ............ *H03K 17/145* (2013.01); *G09G 3/2092* (2013.01); *H01L 29/7869* (2013.01);
(Continued)

(58) Field of Classification Search
CPC ............... H03K 17/145; H03K 17/687; H01L 29/7869; H01L 22/34; H01L 22/14; G09G 3/2092; G09G 2330/02; G09G 2300/043; G09G 2300/08; G09G 2300/12; G01R 31/31924; G01R 31/3004; G01R 31/3008; G01R 31/31922; G01R 31/318511; G01R 31/2884; G01R 31/3194; G01R 31/2831; G01R 35/005; G01R 27/28; G11C 29/56; H05K 999/99

USPC ............. 324/762.01, 762.02, 762.05, 750.01, 324/750.02, 756.05, 73.1, 601

See application file for complete search history.

(56) References Cited

U.S. PATENT DOCUMENTS 6,462,723 B1 * 10/2002 Yamazaki ............ H04N 9/3173
257/365
7,116,606 B2 * 10/2006 Chou .................. H01L 27/0266
365/115

(Continued)

FOREIGN PATENT DOCUMENTS

JP    2001-51292 A    2/2001
JP    2009-063607 A    3/2009

(Continued)

*Primary Examiner* — Tung X Nguyen
*Assistant Examiner* — Thang Le
(74) *Attorney, Agent, or Firm* — Chen Yoshimura LLP

(57) ABSTRACT

A semiconductor device is provided with an oxide semiconductor thin-film transistor (TFT); a calibration electrode that is positioned so as to face an oxide semiconductor layer with an insulating layer therebetween, and, when viewed from the direction of the substrate normal line, overlaps at least part of a gate electrode with the oxide semiconductor layer interposed therebetween; and a calibration voltage setting circuit that determines the voltage to be applied to the calibration electrode. The calibration voltage setting circuit is provided with: a monitor TFT that is configured using a second oxide semiconductor layer, which is substantially the same as the oxide semiconductor layer of the oxide semiconductor TFT; a detection circuit that is configured so as to be able to measure the device characteristics of the monitor TFT; and a voltage determination circuit that determines the voltage to be applied to the calibration electrode on the basis of the measured device characteristics.

11 Claims, 5 Drawing Sheets

(51) Int. Cl.
   *H01L 29/786* (2006.01)
   *H03K 17/687* (2006.01)
   *G09G 3/20* (2006.01)

(52) U.S. Cl.
   CPC ........ *H03K17/687* (2013.01); *G09G 2300/043* (2013.01); *G09G 2300/08* (2013.01); *G09G 2330/02* (2013.01); *G09G 2330/12* (2013.01)

(56) References Cited

U.S. PATENT DOCUMENTS

| | | | |
|---|---|---|---|
| 7,609,236 B2* | 10/2009 | Koyama | G09G 3/2081 345/690 |
| 2006/0244699 A1* | 11/2006 | Yamazaki | G09G 3/3233 345/82 |
| 2010/0244029 A1 | 9/2010 | Yamazaki et al. | |
| 2010/0289020 A1 | 11/2010 | Yano et al. | |
| 2011/0102409 A1 | 5/2011 | Hayakawa | |
| 2012/0034721 A1* | 2/2012 | Okamoto | G02F 1/133555 438/30 |
| 2012/0068915 A1* | 3/2012 | Yamazaki | G09G 3/3233 345/76 |
| 2012/0075260 A1 | 3/2012 | Saito et al. | |
| 2012/0138922 A1 | 6/2012 | Yamazaki et al. | |
| 2014/0361960 A1* | 12/2014 | Yamauchi | G09G 3/3233 345/76 |

FOREIGN PATENT DOCUMENTS

| | | |
|---|---|---|
| JP | 2010-251735 A | 11/2010 |
| JP | 2011-120221 A | 6/2011 |
| JP | 2012-068597 A | 4/2012 |
| JP | 2012-134475 A | 7/2012 |
| WO | 2009/075281 A1 | 6/2009 |

* cited by examiner (a)

(b)

SEMICONDUCTOR DEVICE AND DISPLAY DEVICE

TECHNICAL FIELD

The present invention relates to a semiconductor device formed using an oxide semiconductor, and particularly relates to an active matrix substrate of a liquid crystal display device and an organic EL display device. The semiconductor device includes the active matrix substrate and a display device that is equipped with the active matrix substrate.

BACKGROUND ART

The active matrix substrate employed in a liquid crystal display device and the like is equipped with a switching element in each pixel, such as a thin film transistor (hereinafter referred to as "TFT"). Conventionally, a TFT with an amorphous silicon film as an active layer (hereinafter referred to as "amorphous silicon TFT") or a TFT with a polycrystalline silicon film as an active layer (hereinafter referred to as "polycrystalline silicon TFT") have been widely used as the switching element.

In recent years, there have been attempts to use materials other than amorphous silicon and polycrystalline silicon for the active layer of TFTs. For example, Patent Document 1 discloses a liquid display device that has an active layer of TFTs by using an oxide semiconductor film such as InGaZnO (oxide, which includes indium, gallium and zinc). The aforementioned TFT is called an "oxide semiconductor TFT."

The oxide semiconductor TFTs are possible to actuate faster than the amorphous TFTs. Furthermore, because the oxide semiconductor film is formed by a simpler process than the polycrystalline silicon film, the oxide semiconductor film may also be applied to devices that need a large surface. Therefore, the use of the oxide semiconductor TFTs in display devices and the like are underway as an active element that is possible to manufacture while reducing manufacturing processes and manufacturing costs, and that operates at a higher switching performance.

Furthermore, because the oxide semiconductor has high electron mobility, the oxide semiconductor may achieve at least the equivalent performance of conventional amorphous silicon TFTs even if the size is comparatively small. Because of this, the usage of the oxide semiconductor TFTs enable a reduction in an area occupied by the TFTs within a pixel region of display devices and the like, resulting in the possibility to improve the pixel aperture ratio. Hence, there is a possibility to display a higher brightness or reduce light intensity of a backlight and achieve low power consumption.

There is difficulty increasing the aperture ratio of pixels because of a minimum width of the wiring (process rule), especially for small and high-definition liquid display devices used in smartphones and the like. Thus, improving the pixel aperture ratio using the oxide semiconductor TFTs is advantageous because a high-definition display can be achieved while reducing power consumption.

RELATED ART DOCUMENTS

Patent Document

Patent Document 1: WO 2009/075281
Patent Document 2: Japanese Patent Application Laid-Open Publication No. 2012-134475
Patent Document 3: Japanese Patent Application Laid-Open Publication No. 2010-251735
Patent Document 4: Japanese Patent Application Laid-Open Publication No. 2001-51292

SUMMARY OF THE INVENTION

Problems to be Solved by the Invention

In the manufacturing process of the oxide semiconductor TFTs, a heat treatment of relatively high temperature (approximately 300° C. or higher, for example) is applied to improve the device characteristics thereof. Applying the heat treatment process after the formation of a passivation layer (protective layer) so that the oxide semiconductor layer and a source and a drain electrode are covered is common. If the passivation layer contains a relatively large amount of hydrogen and the abovementioned heat treatment is applied, the device characteristics of TFTs may change due to a diffusion of hydrogen into the oxide semiconductor layer.

In addition, the device characteristics of the TFTs may fluctuate over time due to irradiation of the channel with light or voltage applied to the channel. Patent Document 2 describes the fluctuation of the device characteristics of the oxide semiconductor TFTs, which occurs after the manufacturing of TFTs, and specifically describes that the threshold voltage Vth of the TFTs fluctuates after a stress test. When the threshold voltage Vth of the TFTs fluctuates, problems arise such as a need to increase a driving voltage or an increase in off-leak current. Thus, the usage of a TFT substrate in a display device may lead to a reduction in display quality or an increase in power consumption.

In contrast, Patent Documents 3 and 4 describe a configuration provided with an additional gate electrode (hereinafter, also be referred to as a "back gate electrode" or a "calibration electrode"), which is disposed to oppose the gate electrode with the semiconductor layer interposed therebetween.

Patent Document 3 specifically describes that TFTs with channels that use the oxide semiconductor layer with InGaZnO are able to control the threshold voltage Vth by fixing a prescribed value to a back gate potential.

However, as mentioned above, because the threshold voltage Vth of the oxide semiconductor TFTs changes over time, it was desirable to also properly control the voltage applied to the back gate over an extended period. Furthermore, variability in the device characteristics of the oxide semiconductor TFTs may occur due to the manufacturing process, and it was desirable to properly adjust the device characteristics in such instances. When a display device is manufactured using the oxide semiconductor TFTs, display quality degrades over time and differences in display qualities occur across all products.

The present invention was made to solve the abovementioned problems and the objective of the invention is to provide a semiconductor device that is able to maintain favorable device characteristics.

Means for Solving the Problems

A semiconductor device of one embodiment of the present invention includes: a substrate; an oxide semiconductor thin film transistor formed on the substrate and having a gate electrode, an oxide semiconductor layer facing the gate electrode with a first insulating layer therebetween, and a source electrode and a drain electrode connected to the oxide semiconductor layer; a calibration electrode facing the oxide semiconductor layer with a second insulating layer therebetween and overlapping, when viewed from a direction normal to the substrate, at least part of the gate electrode, the oxide semiconductor layer being interposed between the gate electrode and the calibration electrode; and a calibration voltage setting circuit that determines a voltage to be applied to the calibration electrode; wherein the calibration voltage setting circuit comprises: a monitor thin film transistor formed on the substrate and comprising a second oxide semiconductor layer being made of the same oxide semiconductor material as the oxide semiconductor layer of the oxide semiconductor thin film transistor, the monitor thin film transistor having a gate electrode, a source electrode, and a drain electrode; a detection circuit that is configured to measure device characteristics of the monitor thin film transistor; and a voltage determination circuit that determines the voltage to be applied to the calibration electrode in accordance with the device characteristics that are measured by the detection circuit.

In one embodiment, the semiconductor device further includes a second calibration electrode facing the gate electrode of the monitor thin film transistor with the second oxide semiconductor layer thereof interposed therebetween when viewed from the direction normal to the substrate, wherein, when the device characteristics measured by the detection circuit are within a prescribed range, the voltage determination circuit determines that a voltage applied to the second calibration electrode during the measurement is the voltage to be applied to the calibration electrode, and wherein, when the measured device characteristics are not within the prescribed range, the voltage determination circuit causes the voltage applied to the second calibration electrode to change, and the detection circuit repeats detection of the device characteristics of the monitor thin film transistor while the voltage that has been caused to change is applied to the second calibration electrode.

In one embodiment, the calibration voltage setting circuit sets the voltage to be applied to the calibration electrode when a start signal is received.

In one embodiment, the start signal is regularly sent to the calibration voltage setting circuit in predetermined time intervals.

In one embodiment, the start signal is sent to the calibration voltage setting circuit in response to user input.

In one embodiment, a reference gate voltage is applied to the gate electrode of the monitor thin film transistor, a reference source voltage is applied to the source electrode of the monitor thin film transistor, and the detection circuit detects a value of a current flowing through the drain electrode of the monitor thin film transistor.

In one embodiment, an active layer of the oxide semiconductor thin film transistor includes indium-gallium-zinc-oxide.

In one embodiment, the indium-gallium-zinc-oxide is crystalline indium-gallium-zinc-oxide.

In one embodiment, the gate electrode of the oxide semiconductor thin film transistor and the gate electrode of the monitor thin film transistor are connected to the same gate bus line.

A display device according to one embodiment of the present invention includes any one of the semiconductor devices mentioned above, wherein the display device includes a display area and a non-display area that is disposed outside of the display area, wherein the oxide semiconductor thin film transistor of the semiconductor device is provided within the display area, and wherein the monitor thin film transistor of the semiconductor device is provided within the non-display area.

In one embodiment, the non-display area is provided with a driver circuit comprising an element that includes the oxide semiconductor and a third calibration electrode provided on the element, and the calibration voltage setting circuit is configured so as to determine a voltage applied to the third calibration electrode of the driver circuit.

Effects of the Invention

According to the semiconductor device of the embodiment of the present invention, there is a possibility to manufacture a high yield of TFT substrates provided with the oxide semiconductor TFTs with good device characteristics.

DETAILED DESCRIPTION OF EMBODIMENTS

As a semiconductor device according to embodiments of the present invention, a TFT substrate (active matrix substrates) used in a liquid display device will be explained below with reference to drawings. However, the present invention is not limited to the embodiments below.

Figure 1:
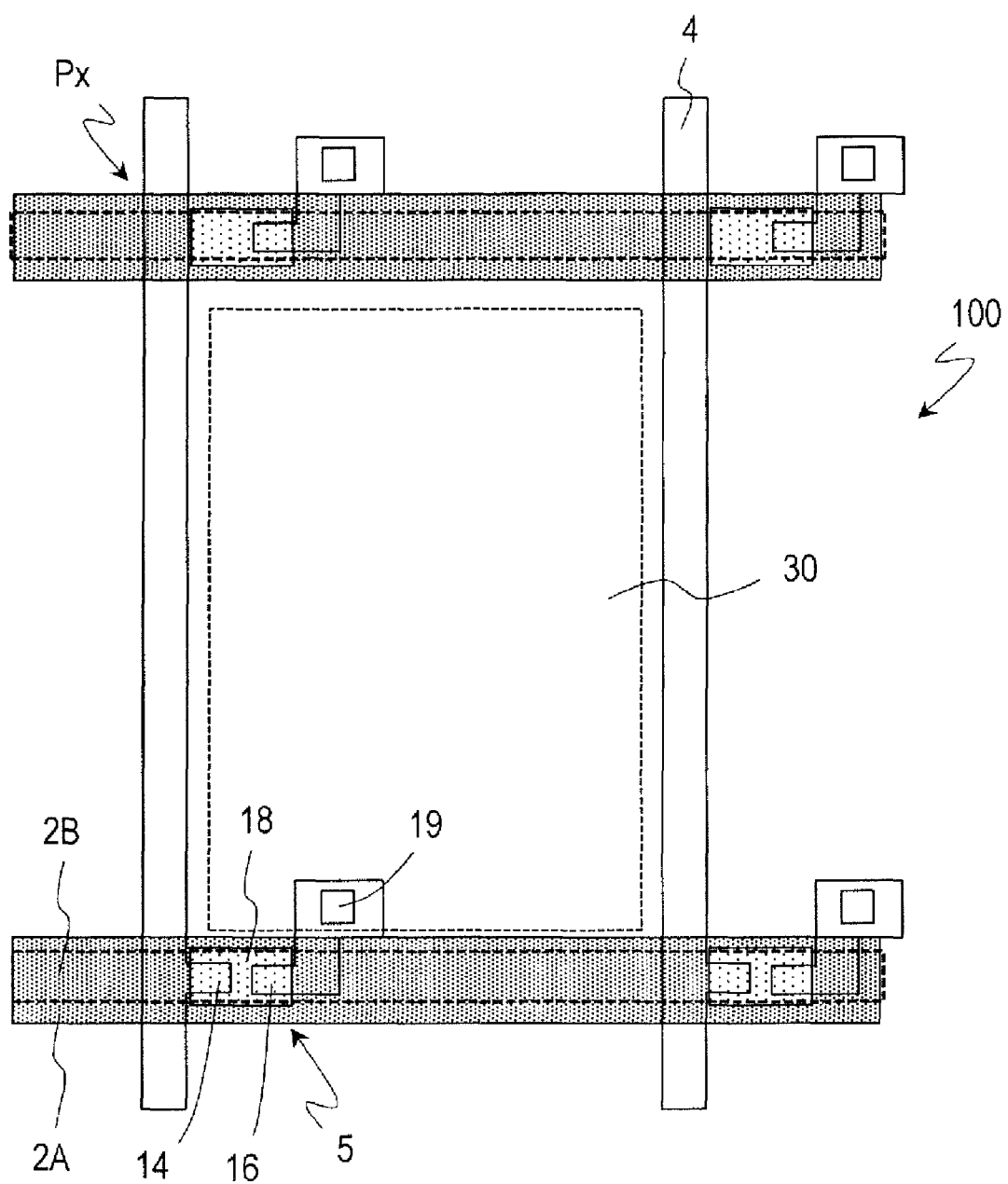
FIG. 1 is a plan view that shows an area corresponding to approximately one pixel provided in a TFT substrate according to an embodiment of the present invention.

FIG. 1 shows an area corresponding to approximately one pixel Px of a TFT substrate 100 according to an embodiment of the present invention.

On the TFT substrate 100, there are a plurality of gate bus lines (scan lines) 2A, which extend in a horizontal direction, and a plurality of source bus lines (signal lines) 4, which extend in a perpendicular direction so as to intersect with gate bus lines 2A. The area near the intersection of the bus lines 2A and source bus lines 4 is provided with an oxide semiconductor TFT 5 as the switching element.

The present embodiment is provided with a pixel electrode 30 in the areas surrounded by the two adjacent gate bus lines 2A and the two adjacent source bus lines 4. The pixel electrode 30 is connected to a drain of the oxide semiconductor TFT 5 at a contact hole 19.

Furthermore, the TFT substrate 100 is provided with wiring for the back gate (wiring for the calibration electrode) 2B, which extends in a horizontal direction so that there is an overlap with the gate bus line 2A. As mentioned below, the wiring for the back gate 2B is used to adjust the threshold voltage Vth of the oxide semiconductor TFT 5.

Figure 2:
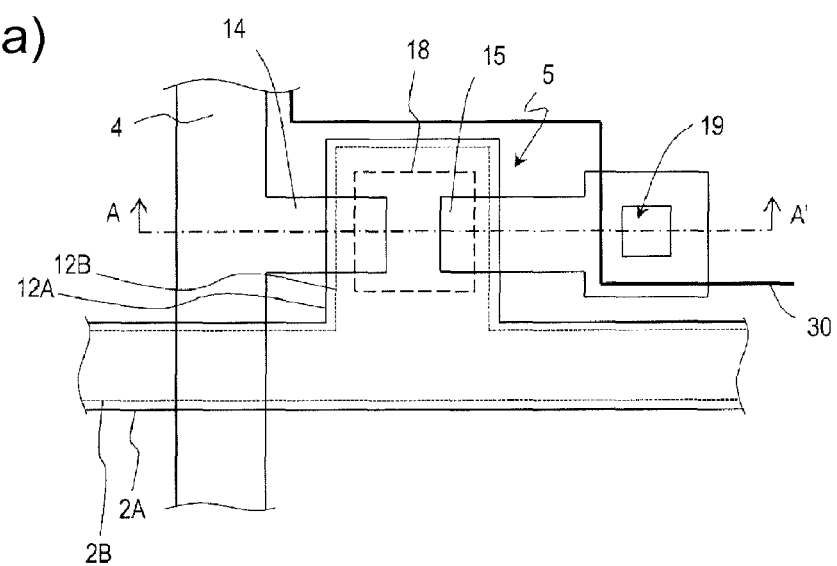
FIG. 2(a) is a plan view that shows an enlarged TFT, and (b) is a cross-sectional view along the line A-A' in FIG. 2(a).
Figure 2:
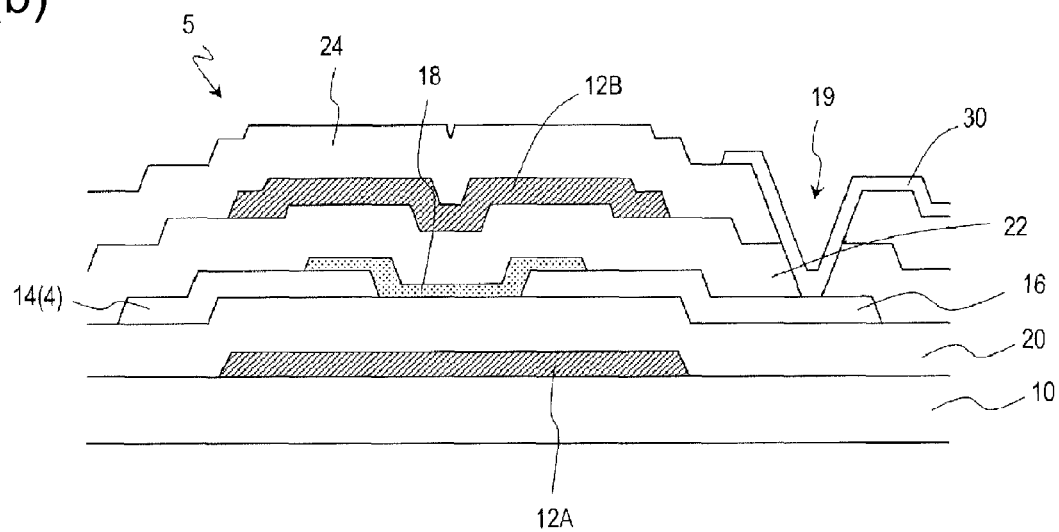

FIGS. 2(a) and 2(b) are a plan view and a cross-sectional view of the oxide semiconductor TFT 5. Furthermore, FIGS. 2(a) and 2(b) show the connection configuration between the oxide semiconductor TFT 5 and the pixel electrode 30. FIG. 2(a) also shows a form of the gate bus line 2A and gate electrode 12A that is more distinguishable than the form shown in FIG. 1, and FIG. 2(b) shows a cross-section along the line A-A' in FIG. 2(a).

The TFT substrate 100 is composed by using a transparent substrate 10 formed by glass, plastic, or the like, and on the transparent substrate 10 is a gate electrode 12A, a gate insulating layer 20 covering the gate electrode 12A, a source electrode 14 and a drain electrode 16 formed on the gate insulating layer 20, and an insular oxide semiconductor layer 18, which covers the gap between the source electrode 14 and the drain electrode 16 and connects to them.

A second gate insulating layer 22 is provided on the oxide semiconductor layer 18, and on this insulating layer is provided a back gate electrode 12B used to calibrate or compensate for the threshold voltage of the TFT. The back gate electrode 12B may also be referred to as a calibration electrode 12B in this specification.

The back gate electrode 12B is disposed to overlap with the oxide semiconductor layer 18 when viewed from the normal direction of the substrate. Furthermore, the oxide semiconductor layer 18 is disposed to overlap the gate electrode 12A. For that reason, the back gate electrode 12B is disposed with the semiconductor layer 18 interposed therebetween, with an overlap with the gate electrode 12A.

Furthermore, unlike the present embodiment, there is a possibility to use the gate electrode (or the gate bus line) as a back gate electrode (or wiring for a calibration electrode), and a back gate electrode (or wiring for calibration electrode) as the gate electrode.

Here, an amorphous oxide semiconductor constituted of In—Ga—Zn—O, which includes In, Ga and Zn at a 1:1:1 ratio, is preferably used as material for the oxide semiconductor layer 18. However, the ratio of In, Ga and Zn may be selected appropriately without being limited to the description above. Furthermore, a different oxide semiconductor may be used in place of InGaZnO.

For example, the oxide semiconductor layer 18 may be formed by $InGaO_3$ $(ZnO)_5$ film, magnesium zinc oxide ($Mg_xZn_{1-x}O$), or cadmium zinc oxide ($Cd_xZn_{1-x}O$), cadmium oxide (CdO) and the like. Furthermore, the oxide semiconductor layer 18 may be formed using one kind from a group 1 element, a group 13 element, a group 14 element, a group 15 element, a group 17 element, or the like, or using ZnO with a plurality of kinds of added impurities. The ZnO does not need to have impurities added. Furthermore, the ZnO may be in an amorphous state or a polycrystalline state, or a microcrystalline state combining an amorphous state and a polycrystalline state.

An amorphous InGaZnO has the advantage of being able to be manufactured at low temperatures and achieving high mobility. However, InGaZnO with crystalline may be used in the place of amorphous InGaZnO. A crystalline InGaZnO layer with the c-axis oriented approximately perpendicular to the layer surface is preferable for the crystalline InGaZnO layer. Such crystalline structure of an InGaZnO layer is disclosed in Japanese Patent Application Laid-Open Publication No. 2012-134475 (Patent Document 2), for example.

On the back gate electrode 12B, a passivation layer 24 is provided to protect the oxide semiconductor TFT 5, and on top of this is provided the pixel electrode 30, which is formed from transparent conductive material. Also, if used as the active matrix substrate of a liquid crystal display device, an organic interlayer insulating layer (not shown) is provided on the passivation layer 24, and the pixel electrode 30 may be provided on the organic interlayer insulating layer.

The pixel electrode 30 and the drain electrode 16 of the TFT 5 are electrically connected by the contact hole 19, which is formed to penetrate the passivation layer 24 and the second gate insulating film 22. Because of this, there is a possibility to apply a prescribed voltage through the source bus line 4 to the pixel electrode 30 when the TFT 5 is on.

The TFT 5 is turned on by applying voltage to the gate electrode 12A of at least the threshold voltage Vth, and the TFT 5 is configured so that a source electrode 14 and the drain electrode 16 are conducted through the channel of the semiconductor layer 18. The threshold voltage Vth is set between 1-5V, for example.

Here, the backgate electrode 12B is explained. The potential of the back gate electrode 12B may be set to a prescribed value through the back gate wiring 2B. The threshold voltage Vth of the TFT 5 may be changed if the potential of the back gate electrode 12B is changed. For the present embodiment, when the back gate electrode 12B has a prescribed potential, if the threshold voltage Vth of the TFT 5 is appropriate, it is preferable that the back gate electrode 12B be kept at the prescribed potential. Furthermore, if the threshold voltage Vth is not appropriate, it is preferable that the threshold Vth be adjusted by changing the potential of the back gate electrode 12B.

Figure 3:
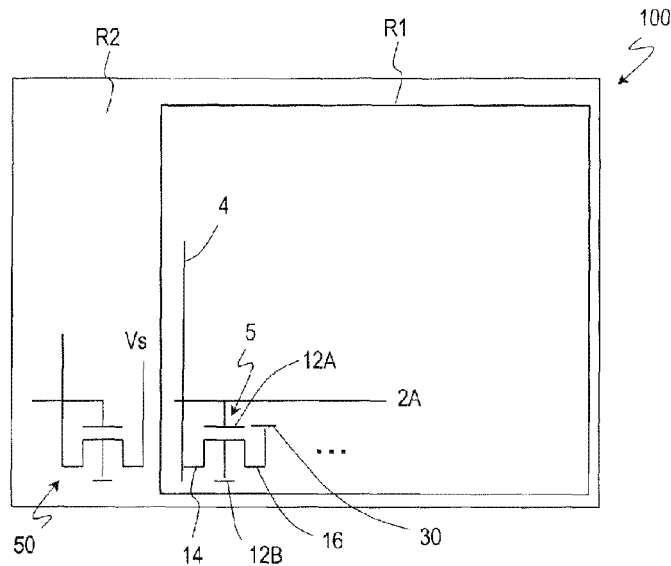
FIG. 3 is a plan view that shows a display area and a non-display area on a TFT substrate.

FIG. 3 shows the overall configuration of the TFT substrate 100 of the present embodiment. As FIG. 3 shows, the TFT substrate 100 is provided with a display area R1, which has a plurality of pixels arranged in a matrix, and a non-display area (also referred to as framed area) R2, which is disposed outside of the display area. The non-display area R2 is provided with a characteristic measurement circuit 50, which is equipped with a calibration voltage setting circuit 50A (see FIG. 6) to determine the potential of the back gate electrode 12B.

Figure 4:
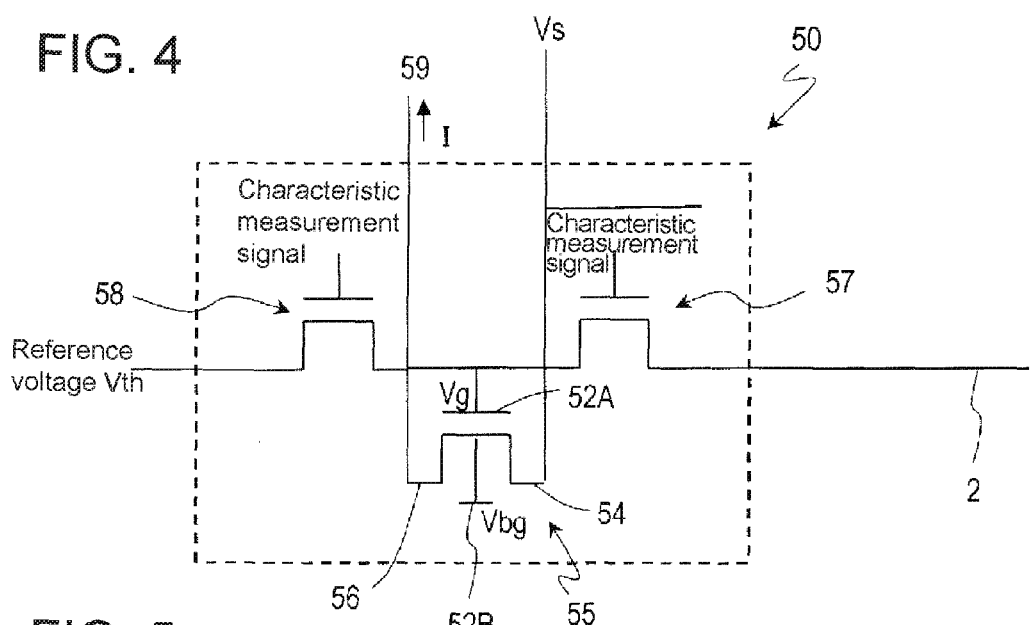
FIG. 4 is a circuit configuration that shows a configuration of a characteristic measurement circuit provided in a calibration voltage determining circuit.

FIG. 4 shows a more detailed configuration of the characteristic measurement circuit 50. The characteristic measurement circuit 50 has the oxide semiconductor TFT 5 (henceforth also be referred to as a pixel TFT 5), provided in the display area R1, and a monitor TFT 55, which is formed to have approximately the same configuration. The monitor TFT 55 is configured to at least use the same oxide semiconductor layer as the oxide semiconductor layer 18 of the oxide semiconductor TFT 5, and it is preferable that the shapes of the gate electrode, the source electrode and the drain electrode are similar to the pixel TFT 5.

Furthermore, the monitor TFT 55 is also provided on a back gate electrode (calibration electrode) 52B, similar to the pixel TFT 5. The back gate electrode (calibration electrode) 52B is the same as the pixel TFT 5, and is disposed to overlap with the gate electrode 52A of the monitor TFT 55 when viewed from the normal direction of the substrate.

A reference source voltage Vs is constantly applied to a source electrode 54 of the monitor TFT 55. The reason for this is that by imposing the same usage conditions as the pixel TFT 5 to the monitor TFT 55, the same fluctuation of the device characteristics that may occur over time to the pixel TFT 5 would occur in the monitor TFT 55. Similarly, it is preferable that the same gate voltage Vg applied to the pixel TFT 5 also be applied to gate electrode 52A of the monitor TFT 55.

When the characteristic measurement circuit 50 receives an external characteristic measurement signal (a start signal), the device characteristics are measured using the monitor TFT 55. Furthermore, the characteristic measurement circuit 50 is configured so that the potential of the back gate electrode 12B, which is provided for the pixel TFT 5, is set based on measuring results.

For this reason, the characteristic measurement circuit 50 has a first switching TFT 57 provided between the gate bus line 2A and a gate electrode 52A for the monitor TFT 55, and a second switching TFT 58 provided between a circuit, which generates a voltage Vth that is the reference, and a gate electrode 52A of the monitor TFT 55.

Furthermore, a drain electrode 56 of the monitor TFT 55 is connected through a current detection terminal to the drain current measuring device (hereinafter, also be referred to as a current measuring device 59). The current measuring device 59 is configured to measure the size of the current (current value I) that flows through the drain electrode 56 of the monitor TFT 55. The current measuring device 59 may have a well-known configuration.

Figure 5:
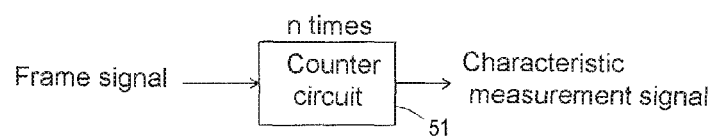
FIG. 5 is a block diagram that shows a start signal generating circuit.

FIG. 5 shows an example of a start signal generating circuit configured so that a start signal (a characteristic measurement signal) sent to the characteristic measurement circuit 50 is outputted. In the form shown in FIG. 5, the start signal generating circuit is configured to count the number of times n that the frame signal is received according to a counter circuit 51, and when the counter value reaches the prescribed number (i.e., when the prescribed frame period has elapsed), the characteristic measurement signal is outputted. The characteristic measurement signal may output at the rate of once every 1000 hours, for example. Of course, the start signal may be outputted regularly in shorter intervals.

Furthermore, the start signal may be sent to a characteristic measurement circuit (or the calibration voltage setting circuit) based on an input of a user. For example, a design would be preferable in which a button for calibration is displayed on a setting screen of a display device, and the start signal is sent to the calibration voltage setting circuit when a user presses the button for calibration using a remote control or the like.

FIG. 4 is referenced again. Before the character measuring circuit 50 receives the start signal that instructs the measurement of the device characteristics (specifically, the drain current value) of the monitor TFT 55, the first switching TFT 57 is turned on and the second switching TFT 58 is turned off so that the same gate voltage as the pixel TFT 5 is applied after going through the gate bus line 2A. Furthermore, reference source voltage Vs is applied to the source electrode 54 of the monitor TFT 55. In this way, the monitor TFT 55 is regularly placed in the same operating environment as the pixel TFT 5. In other words, the device characteristics of the monitor TFT 55 may also fluctuate if the device characteristics of the pixel TFT 5 fluctuate over time.

On the other hand, when the start signal instructing the measurement of the device characteristics of the monitor TFT 55 is received, a first switching TFT 57 is turned off, and a switching second TFT 58 is turned on. This enables a reference threshold voltage Vth0 to be applied to the gate electrode 52A of the monitor TFT 55.

The present embodiment detects the size of the current outputted to the drain electrode 56 when the reference threshold voltage Vth0 is applied to the gate electrode 52A of the monitor TFT 55 by using the current measuring device 59, and by doing so the present embodiment measures the device characteristics (threshold voltage Vth) of the monitor TFT 55. When the reference voltage Vth0 is applied, if the threshold voltage Vth of the monitor TFT 55 fluctuates from the initial state, the value of the drain current detected by the current detection circuit 59 also fluctuates. Therefore, the fluctuation of threshold voltage Vth may be detected by measuring the drain current I.

Furthermore, when the variation of the threshold voltage Vth is detected, the threshold voltage Vth may be calibrated by applying the prescribed voltage to a calibration electrode (back gate electrode) 52B, so as to compensate for the variation. A more detailed explanation of the process for deciding the voltage to be applied to the calibration electrode 52B is described below.

Figure 6:
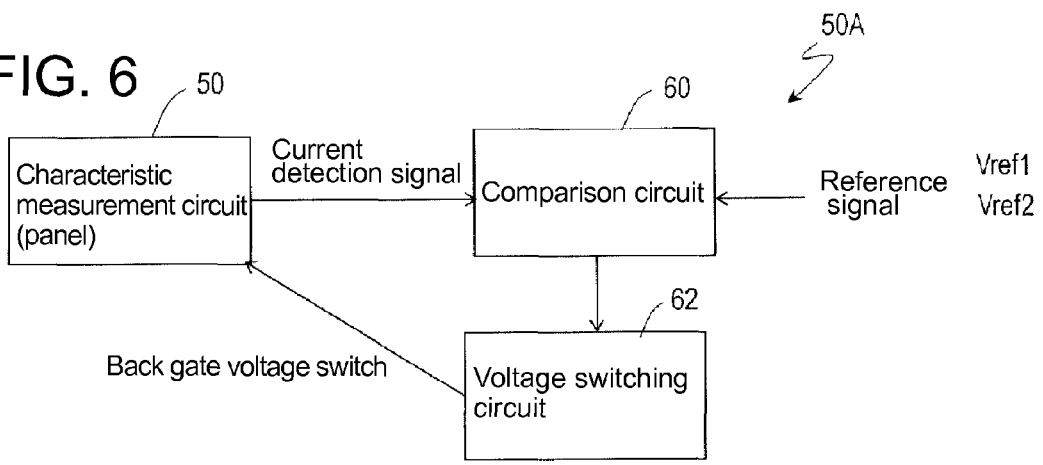
FIG. 6 is a block diagram that shows a calibration voltage determining circuit.

FIG. 6 shows the configuration of the calibration voltage setting circuit 50A. The calibration voltage setting circuit 50A has the characteristic measurement circuit 50, a comparison circuit 60, which is connected to an output of the characteristic measurement circuit 50, and a voltage switching circuit 62, which is connected to the output of the comparison circuit 60. The voltage switching circuit 62 is configured to change the backgate voltage of the monitor TFT 55 of the characteristic measurement circuit 50 as necessary based on the output of the comparison circuit 60.

Figure 7:
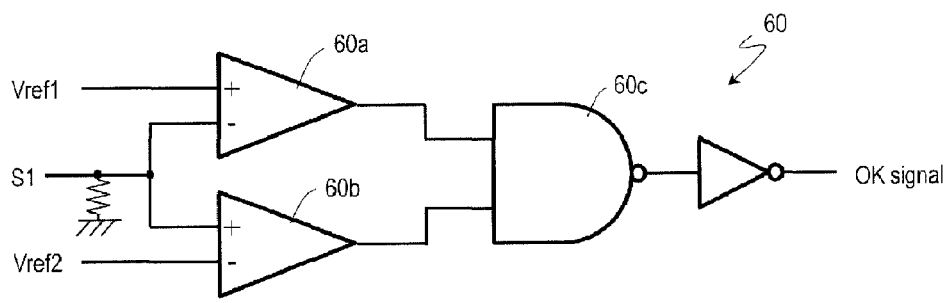
FIG. 7 is a circuit diagram that shows a comparator circuit.

FIG. 7 shows a detailed circuit configuration of the comparison circuit 60. As FIG. 7 shows, the comparison circuit 60 has a first comparator 60a, which receives input of the upper limit of the reference voltage Vref1 and a second comparator 60b, which receives input of the lower limit of the reference voltage Vref2. The first comparator 60a, the second comparator 60b, NAND circuit 60c and the like are used to judge whether the current detection signal S1 is between the upper limit reference voltage Vref1 and the lower limit reference voltage Vref2. The comparison circuit 60 outputs an OK signal if the current detection signal S1 is within the prescribed range. Furthermore, if the current detection signal S1 is not within the prescribed range, an instruction is outputted to the voltage switching circuit 62 to change the back gate voltage of the monitor TFT 55.

Figure 8:
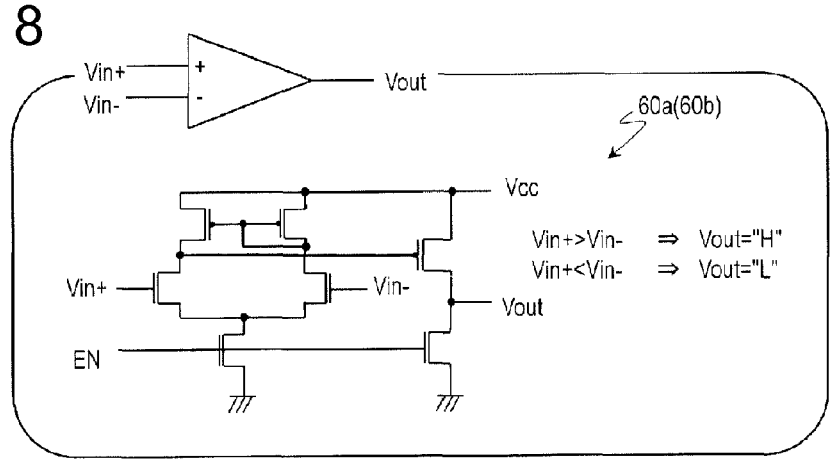
FIG. 8 is a drawing that shows a detailed circuit configuration of the comparator.

Furthermore, FIG. 8 shows a detailed circuit configuration of the first comparator 60a and the second comparator 60b. Additionally, the comparison circuit 60 is not limited to the shown form and may have various well-known forms.

Figure 9:
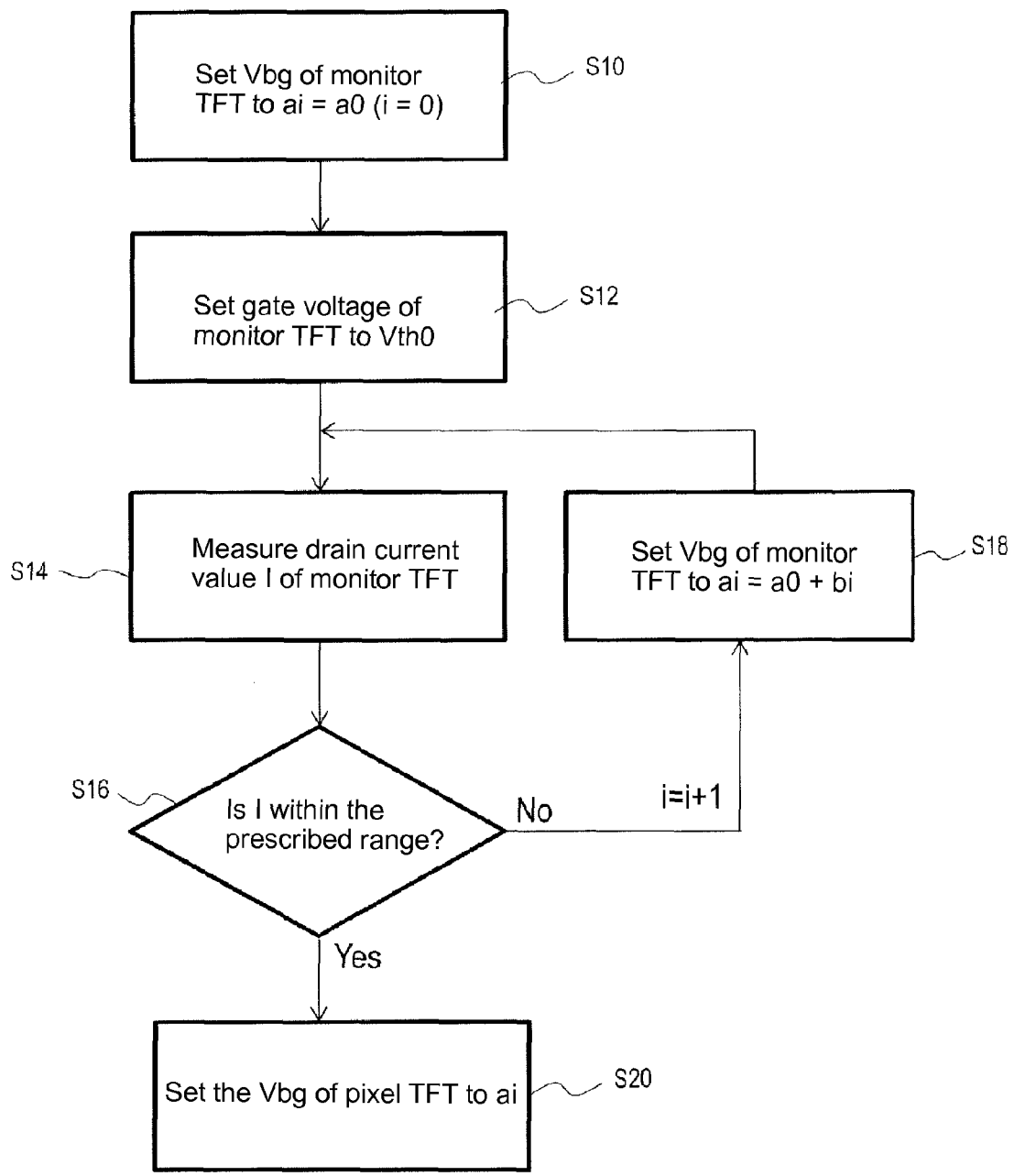
FIG. 9 is a flowchart to explain the operation of a calibration voltage determining circuit.

FIG. 9 is a flowchart that shows the back gate voltage Vbg setting process of the calibration voltage setting circuit 50A.

First, as shown in step S10, the initial value of the back gate voltage Vbg of the monitor TFT 55 (voltage applied to the back gate electrode 52B) is set at ai=a0 (i=0). The initial value is set at 0V, for example, when first calibrating the back gate voltage. Furthermore, when calibrating the second time and beyond, the initial value a0 is given to the back gate voltage that was set to the previous calibration, for example.

Next, as shown in step S12, in response to the received start signal, the gate voltage of the monitor TFT 55 is set to the reference threshold voltage Vth0, using the switching TFTs 57 and 58. At this time, the source reference voltage Vs is applied to the source electrode 54 of the monitor TFT 55.

Next, as shown in step S14, the drain current value I of the monitor TFT 55 is measured using the current measuring device 59.

Next, as shown in step S16, it is judged whether the drain current value I, which is measured in step S14, is within the threshold of the prescribed value.

The comparison circuit 60 is used in step S16. The range that the drain current value I should fall within is determined to correspond with the range of the threshold voltage Vth of the desired TFT. More specifically, when drain current value I is within the prescribed range, it can be determined that the threshold voltage Vth of the TFT is set at the appropriate state. On the other hand, if drain current value I is not within the determined range, it can be determined that the threshold voltage Vth of the TFT is not set at the appropriate state.

If the drain current value I is within the prescribed range in step S16, then as step S20 shows, the current back gate voltage Vbg=ai is judged to be appropriate, and the voltage is applied to the back gate electrode of the pixel TFT 5. Because of this, the threshold voltage of the pixel TFT 5 can be controlled appropriately.

In addition, when drain voltage value I is not within the prescribed range in step S16, the back gate voltage Vbg of the monitor TFT 55 is judged to be not appropriate. Therefore, as shown in step S18, the back gate voltage Vbg is changed to a value different from the current value (a0+bi, for example). The parameter value (only bi, for example), which determines the different value, may be stored as a set of the current value in a table stored within the hardware of the memory, and the like.

In this way, after the back gate voltage Vbg of the monitor TFT 55 is changed, the drain current value I of the monitor TFT 55 is measured again, as shown in step S14. In addition, the drain current value I is judged as to whether it is within the prescribed range (step S16), and when the drain current value I is not within the prescribed range, the back gate voltage Vbg of the monitor TFT 55 is further changed to another value (step S18).

By performing the abovementioned operations, the value ai (i.e. a back gate voltage value that makes the threshold Vth appropriate), which places the drain current value I of the monitor TFT 55 within the prescribed range, can be found. Also, this is the way the discovered back gate voltage value ai can be applied as the back gate voltage Vbg of the pixel TFT 5. Because of this, the threshold voltage of the pixel TFT 5 can be the proper value.

This concludes the explanation of the embodiment of the present invention, and needless to say, various modifications are possible. For example, a TFT with the gate electrode disposed on the bottom side of the semiconductor layer and the calibration electrode disposed on the top side of the semiconductor layer is explained above, but the TFT may conversely have the gate electrode disposed on the upside of the semiconductor layer and the calibration electrode on the bottom side of the semiconductor layer.

Furthermore, a TFT of a bottom contact structure, in which the bottom surface of the semiconductor layer touches the source electrode and the drain electrode, was explained above, but the TFT may be of a top contact structure in which the top surface of the semiconductor layer touches the source electrode and the drain electrode.

Furthermore, the non-display area R2 shown in FIG. 3 may be provided with a driver circuit to drive pixels (gate driver circuit, for example). The driver circuit may be configured using the oxide semiconductor TFTs. Therefore, the semiconductor TFT used by this driver circuit may be provided with the calibration electrode (backgate electrode) described above, and the voltage applied to this calibration electrode may be determined by using the above-mentioned calibration electrode setting circuit.

The active matrix substrate used in a liquid crystal display device was explained above, but there is also the possibility to manufacture the active matrix substrate for an organic EL display device. The organic EL display device is equipped with a light emitting element, which is provided on each pixel, and this light emitting element has an organic EL layer, a switching TFT, and a driving TFT, and the semiconductor device according to the embodiments of the present invention can be used as these TFTs. Furthermore, a storage element (oxide semiconductor thin film memory) may be configured by aligning TFTs in an array and using these as selection transistors. Application is also possible on an image sensor.

INDUSTRIAL APPLICABILITY

The semiconductor device according to the embodiment of the present invention is preferably used for a TFT substrate for a display device or for the method of manufacturing the TFT substrates, and the like.

DESCRIPTION OF REFERENCE CHARACTERS

2A gate bus line
2B back gate bus line
4 source bus line
5 TFT (oxide semiconductor TFT)
10 substrate
12A gate electrode
12B back gate electrode (calibration electrode)
14 source electrode
16 drain electrode
18 oxide semiconductor layer
20 gate insulating layer
22 second gate insulating layer
24 passivation layer
30 pixel electrode
100 TFT substrate
R1 display area
R2 non-display area

What is claimed is:

1. A semiconductor device, comprising:
a substrate;
an oxide semiconductor thin film transistor formed on said substrate and having a gate electrode, an oxide semiconductor layer facing said gate electrode with a first insulating layer therebetween, and a source electrode and a drain electrode connected to said oxide semiconductor layer;
a calibration electrode facing said oxide semiconductor layer with a second insulating layer therebetween and overlapping, when viewed from a direction normal to the substrate, at least part of said gate electrode, said oxide semiconductor layer being interposed between said gate electrode and said calibration electrode; and
a calibration voltage setting circuit that determines a voltage to be applied to said calibration electrode;
wherein said calibration voltage setting circuit comprises:
a monitor thin film transistor formed on the substrate and comprising a second oxide semiconductor layer being made of the same oxide semiconductor material as the oxide semiconductor layer of said oxide semiconductor thin film transistor, said monitor thin film transistor having a gate electrode, a source electrode, and a drain electrode;
a detection circuit that is configured to measure device characteristics of said monitor thin film transistor; and
a voltage determination circuit that determines said voltage to be applied to the calibration electrode in accordance with said device characteristics that are measured by the detection circuit.

2. The semiconductor device according to claim 1, further comprising:
a second calibration electrode facing said gate electrode of the monitor thin film transistor with said second oxide semiconductor layer thereof interposed therebetween when viewed from the direction normal to the substrate,
wherein, when said device characteristics measured by the detection circuit are within a prescribed range, said voltage determination circuit determines that a voltage applied to said second calibration electrode during said measurement is the voltage to be applied to the calibration electrode, and wherein, when said measured device characteristics are not within the prescribed range, said voltage determination circuit causes the voltage applied to said second calibration electrode to change, and the detection circuit repeats detection of the device characteristics of the monitor thin film transistor while the voltage that has been caused to change is applied to the second calibration electrode.

3. The semiconductor device according to claim 1, wherein said calibration voltage setting circuit sets the voltage to be applied to said calibration electrode when a start signal is received.

4. The semiconductor device according to claim 3, wherein said start signal is regularly sent to said calibration voltage setting circuit in predetermined time intervals.

5. The semiconductor device according to claim 3, wherein said start signal is sent to said calibration voltage setting circuit in response to user input.

6. The semiconductor device according to claim 1,
wherein a reference gate voltage is applied to the gate electrode of the monitor thin film transistor,
wherein a reference source voltage is applied to the source electrode of the monitor thin film transistor, and
wherein the detection circuit detects a value of a current flowing through the drain electrode of the monitor thin film transistor.

7. The semiconductor device according to claim 1, wherein an active layer of said oxide semiconductor thin film transistor includes indium-gallium-zinc-oxide.

8. The semiconductor device according to claim 7, wherein said indium-gallium-zinc-oxide is crystalline indium-gallium-zinc-oxide.

9. The semiconductor device according to claim 1, wherein the gate electrode of the oxide semiconductor thin film transistor and the gate electrode of the monitor thin film transistor are connected to the same gate bus line.

10. A display device, comprising:
the semiconductor device according to claim 1,
wherein said display device includes a display area and a non-display area that is disposed outside of the display area,
wherein the oxide semiconductor thin film transistor of said semiconductor device is provided within said display area, and
wherein said monitor thin film transistor of said semiconductor device is provided within said non-display area.

11. The display device according to claim 10,
wherein said non-display area is provided with a driver circuit comprising an element that includes said oxide semiconductor and a third calibration electrode provided on said element, and
wherein said calibration voltage setting circuit is configured so as to determine a voltage applied to said third calibration electrode of said driver circuit.

* * * * *